United States Patent [19]
Chiang et al.

[11] Patent Number: 5,700,739
[45] Date of Patent: Dec. 23, 1997

[54] METHOD OF MULTI-STEP REACTIVE ION ETCH FOR PATTERNING ADJOINING SEMICONDUCTOR METALLIZATION LAYERS

[75] Inventors: An-Min Chiang, Hsin-chu; Wei-Kun Yeh, Hsinchu, both of Taiwan

[73] Assignee: Taiwan Semiconductor Manufacturing Company Ltd, Hsin-Chu, Taiwan

[21] Appl. No.: 510,826

[22] Filed: Aug. 3, 1995

[51] Int. Cl.$^6$ ................................................ H01L 21/44
[52] U.S. Cl. ............................ 438/655; 438/656; 438/751
[58] Field of Search ................................ 437/190, 195

[56] References Cited

U.S. PATENT DOCUMENTS

| | | | |
|---|---|---|---|
| 4,410,622 | 10/1983 | Dalal et al. | 437/190 |
| 4,954,423 | 9/1990 | McMann et al. | 437/190 |
| 5,346,586 | 9/1994 | Keller | 156/656 |
| 5,369,053 | 11/1994 | Fang | 437/194 |
| 5,436,199 | 7/1995 | Brighton | 437/190 |
| 5,518,963 | 5/1996 | Park | 437/195 |

OTHER PUBLICATIONS

VLSI Technology by Smsze, published by McGraw–Hill Book Co, Singapore, 1988, p. 226.

Primary Examiner—Charles L. Bowers, Jr.
Assistant Examiner—Lynne A. Gurley
Attorney, Agent, or Firm—George O. Saile; Stephen B. Ackerman; Alek P. Szecsy

[57] ABSTRACT

A method for forming patterned conductor metallization layers adjoining patterned barrier metallization layers upon semiconductor substrates. A semiconductor substrate is provided which has formed upon its surface a patterned second masking layer upon a blanket first masking layer. The patterned second masking layer is formed from a photoresist material and the blanket first masking layer is formed from a silicon oxide material, a silicon nitride material or a silicon oxynitride material. Beneath the blanket first masking layer resides a blanket multi-layer metallization stack which includes a blanket conductor metallization layer adjoining a blanket barrier metallization layer. The blanket first masking layer and the upper lying blanket metallization layer of the blanket conductor metallization layer and the blanket barrier metallization layer are successively patterned through a Reactive Ion Etch (RIE) process using as the etch mask the patterned second masking layer. The patterned second masking layer is then removed. The remaining lower lying metallization layer is then patterned through a Reactive Ion Etch (RIE) process using a patterned first masking layer and the patterned upper metallization layer as the etch mask.

16 Claims, 2 Drawing Sheets

METHOD OF MULTI-STEP REACTIVE ION ETCH FOR PATTERNING ADJOINING SEMICONDUCTOR METALLIZATION LAYERS

BACKGROUND OF THE INVENTION

1. Field of the Invention

The present invention relates generally to methods for patterning blanket metallization layers formed upon semiconductor substrates. More particularly, the present invention relates to a multi-step Reactive Ion Etch (RIE) method for successively patterning a blanket conductor metallization layer adjoining a blanket barrier metallization layer upon a semiconductor substrate.

2. Description of Background Art

Integrated circuit device chips are typically fabricated from semiconductor substrates upon whose surfaces are formed resistors, transistors, diodes and other electrical circuit elements. These electrical circuit elements are connected internally and externally to the semiconductor substrate upon which they are formed through patterned conductor layers which are separated by insulator layers.

As semiconductor technology has evolved, the methods and materials through which patterned conductor layers are formed upon semiconductor substrates have changed significantly. In particular, it is now quite common for patterned conductor layers upon semiconductor substrates to be formed through patterning of blanket multi-layer metallization stacks formed upon those semiconductor substrates. These blanket multi-layer metallization stacks will typically include a thick blanket conductor metallization layer, such as an aluminum containing metallization layer, as the major component. In addition, there will typically also be included beneath and/or above the thick blanket conductor metallization layer one or more thinner blanket metallization layers which provide other desirable characteristics to the blanket multi-layer metallization stack or the patterned conductor layers which are formed from the blanket multi-layer metallization stack. Such characteristics may include abrasion resistance characteristics, anti-reflection characteristics, adhesion promotion characteristics and/or substrate inter-diffusion barrier formation characteristics. Typical materials from which are formed these thinner blanket metallization layers include metal silicides, metal nitrides, refractory metal alloys, precious metals and nonaluminum containing metal alloys.

Complementing the breadth of materials from which are formed blanket multi-layer metallization stacks through which in turn are formed patterned conductor layers in advanced integrated circuits is the sophistication of the methods by which those blanket multi-layer metallization stacks are formed into those patterned conductor layers. It is now quite common in the art that a blanket multi-layer metallization stack will be patterned through processes including direct Reactive Ion Etch (RIE) plasma etching of portions of the blanket multi-layer metallization stack exposed through a patterned photoresist etch mask.

The use of blanket multi-layer metallization stacks and direct Reactive Ion Etch (RIE) patterning of those blanket multi-layer metallization stacks into patterned conductor layers provides several advantages for semiconductor manufacturing process control and semiconductor integrated circuit device performance. However, the etching through patterned photoresist masks of blanket multi-layer metallization stacks into patterned conductor layers through direct Reactive Ion Etch (RIE) processes is not without several problems.

In general the problems relate to exposure of the patterned photoresist mask to the multiple Reactive Ion Etch (RIE) etchant gases which are needed for etching of individual exposed metallization layers within the blanket multi-layer metallization stack. Specific problems include: (1) etch rate inhomogeneities for individual metallization layers, (2) variations in etch rate selectivity for adjoining metallization layers, (3) undercutting of portions of the multi-layered metallization stacks, and (4) unexpected corrosion of metallization layers.

Presumably, several of these problems are interrelated and their basis derives from variations from expected Reactive Ion Etch (RIE) etch plasma behavior due to the presence of multiple reactive substrate materials within the same Reactive Ion Etch (RIE) plasma. When one of the multiple reactive materials to which a Reactive Ion Etch (RIE) plasma is exposed is a patterned photoresist etch mask, the variations may become more severe since photoresist materials are typically more chemically reactive and complex than materials from which are formed blanket multi-layer metallization stacks within advanced integrated circuit devices.

The problems to which the present invention is directed fit within this general discussion of patterning of blanket multi-layer metallization stacks through direct Reactive Ion Etch (RIE) patterning of successive layers of those blanket multi-layer metallization stacks exposed through a patterned photoresist etch mask. Specifically, it has been observed that some patterned photoresist etch masks through which have been patterned aluminum containing conductor metallization layers become difficult to remove from the surface of that aluminum containing conductor metallization layer when the patterned photoresist etch mask is subsequently exposed to a Reactive Ion Etch (RIE) plasma used to successively etch a titanium-tungsten barrier metallization layer underlying the aluminum containing conductor metallization layer. This hardening of the patterned photoresist etch mask presumably relates to a chemical reaction of barrier metallization layer Reactive Ion Etch (RIE) etchant species with the patterned photoresist etch mask overlying the aluminum containing conductor metallization layer.

Correlating with this problem of patterned photoresist etch mask layer hardening is the observation that the underlying titanium-tungsten barrier metallization layer is more susceptible to corrosion when it is etched through a Reactive Ion Etch (RIE) process wherein both the overlying aluminum containing conductor metallization layer and the patterned photoresist etch mask residing upon the aluminum containing conductor metallization layer serve as the etch mask for the underlying titanium-tungsten barrier metallization layer. This corrosion phenomenon is presumably related to out-gassing of species formed into the patterned photoresist etch mask during Reactive Ion Etching (RIE) of the overlying aluminum containing conductor metallization layer. It is towards resolution of these problems that the present invention is directed.

Methods for successively and selectively patterning blanket layers of adjoining materials for use within integrated circuit devices have been described in the art. For example, Keller, in U.S. Pat. No. 5,346,586 describes a method for selectively etching to an underlying blanket gate oxide layer a blanket polysilicon layer within a multi-layer stack of blanket layers within an integrated circuit. The method employs a patterned oxide mask through which the blanket polysilicon layer may be patterned using a Reactive Ion Etch (RIE) plasma.

Also pertinent to the present invention is the disclosure of Fang in U.S. Pat. No. 5,369,053. Fang discloses a method for patterning blanket aluminum metallizations within blanket multi-layer metallization stacks, which method includes the use of a consumable thin patterned photoresist mask upon a blanket oxide or oxynitride layer, below which blanket oxide or oxynitride layer resides the blanket multi-layer metallization stack to be patterned.

Desirable in the art is a general method for patterning blanket multi-layer metallization stacks which contain blanket conductor metallization layers adjoining blanket barrier metallization layers. The patterning is preferably accomplished without corrosion of the metallization layers within the blanket multi-layer metallization stack and without problems associated with removal of hardened photoresist mask residues from the patterned conductor layers which are formed from the blanket multi-layer metallization stacks. Preferably, the general method will be applicable to all blanket multi-layer metallization stacks wherein there is present a blanket conductor metallization layer.

SUMMARY OF THE INVENTION

A first object of the present invention is to provide a method for successively patterning a blanket conductor metallization layer and an adjoining blanket barrier metallization layer within a blanket multi-layer metallization stack through use of a Reactive Ion Etch (RIE) etching process, which method is not susceptible to hardening of a photoresist etch mask used to pattern the blanket multi-layer metallization stack.

A second object of the present invention is to provide a method for successively patterning a blanket conductor metallization layer and an adjoining blanket barrier metallization layer in accord with the first object of the present invention, which method also is not susceptible to corroding metallization layers within the blanket multi-layer metallization stack to be etched.

A third object of the present invention is to provide a method for successively patterning metallization layers in accord with the first object and the second object of the present invention, which method is manufacturable and generally applicable to all blanket multi-layer metallization stacks independent of the ordering of blanket metallization layers within those blanket multi-layer metallization stacks.

In accord with the objects of the present invention, a new method for successively patterning a blanket conductor metallization layer and a blanket barrier metallization layer within a blanket multi-layer metallization stack is described. The method begins by providing a semiconductor substrate having formed upon its surface a blanket conductor metallization layer adjoining a blanket barrier metallization layer. The upper of these two layers is an upper metallization layer. The lower of these two layers is a lower metallization layer. A blanket first masking layer is then formed upon the surface of the upper metallization layer. A patterned second masking layer is then formed upon the surface of the blanket first masking layer. The patterned second masking layer is formed from an organic photoresist material and the blanket first masking layer is formed from a silicon oxide, a silicon nitride or a silicon oxynitride material. The portions of the blanket first masking layer and the upper metallization layer sequentially exposed through the patterned second masking layer are then sequentially etched through exposure to Reactive Ion Etch (RIE) plasmas appropriate for those layers to yield a patterned first masking layer and a patterned upper metallization layer. The patterned second masking layer is then removed. Finally, the lower metallization layer is patterned through etching with a Reactive Ion Etch (RIE) plasma appropriate for that layer, using as a mask the patterned first masking layer and the patterned upper metallization layer.

The method of the present invention is not susceptible to hardening of the patterned second masking layer which is formed from an organic photoresist material. Since the patterned second masking layer is removed prior to exposure to multiple Reactive Ion Etch (RIE) etchant plasmas, the patterned second masking layer is not susceptible to hardening.

Neither does the patterned second masking layer serve as a reservoir to which corrosive Reactive Ion Etch (RIE) etchant gas species from etching of the upper metallization layer may be sorbed and subsequently be desorbed as corrosive species during Reactive Ion Etch (RIE) etching of the lower metallization layer. Since the photoresist from which is formed the patterned second masking layer is removed immediately subsequent to the Reactive Ion Etch (RIE) etching of the upper metallization layer within a blanket multi-layer metallization stack, any etchant species sorbed into the patterned second masking layer will not be desorbed as corrosive species during Reactive Ion Etch (RIE) etching of lower metallization layers within the blanket multi-layer metallization stack.

The method of the present invention is manufacturable and generally applicable to all multi-layer metallization stacks independent of the ordering of metallization layers within those multi-layer metallization stacks. The method of the present invention may be accomplished using integrated circuit fabrication tooling and semiconductor materials which are known in the art. The method of the present invention also does not require unusual limitations to a blanket metallization layer within the blanket multi-layer metallization stack upon which is practiced the present invention. Nor does the method of the present invention require unusual limitations, such as thickness limitations, to the blanket first masking layer or patterned second masking layer which are formed upon the blanket multi-layer metallization stack upon which is practiced the present invention.

BRIEF DESCRIPTION OF THE DRAWINGS

The accompanying drawings, which form a material part of this disclosure, show the following.

DETAILED DESCRIPTION OF THE PREFERRED EMBODIMENTS

The present invention provides a multi-step method for patterning a blanket conductor metallization layer and an adjoining blanket barrier metallization layer within a blanket multi-layer metallization stack for use in semiconductor applications. The present invention provides a method wherein a patterned photoresist etch mask through which the upper metallization layer of the blanket conductor metallization layer and the blanket barrier metallization layer within the blanket multi-layer metallization stack is etched does not chemically harden when the lower metallization layer of those two metallization layers is etched through a subsequent Reactive Ion Etch (RIE) etching process.

The present invention further provides a method wherein the lower metallization layer of an adjoining blanket conductor metallization layer and a blanket barrier metallization layer within a blanket multi-layer metallization stack will not corrode during Reactive Ion Etch (RIE) etching of that lower metallization layer. Finally, the present invention provides a method for patterning a blanket conductor metallization layer adjoining a blanket barrier metallization layer within a blanket multi-layer metallization stack, wherein there are no unusual limitations upon the types or thicknesses of blanket metallization layers within the blanket multi-layer metallization stack. Nor are there any unusual thickness limitations upon the masking layers used to pattern the blanket metallization layers within the blanket multi-layer metallization stack.

The method of the present invention may be practiced upon blanket multi-layer metallization stacks which contain blanket conductor metallization layers adjoining blanket barrier metallization layers within many types of semiconductor integrated circuits. The present invention may be practiced upon blanket multi-layer metallization stacks which reside within Dynamic Random Access Memory (DRAM) integrated circuits, Static Random Access Memory (SRAM) integrated circuits, Application Specific Integrated Circuits (ASICs), integrated circuits containing within their constructions bipolar transistors and integrated circuits containing within their constructions field effect transistors. The method of the present invention has broad applicability to blanket multi-layer metallization stacks within integrated circuits.

Figure 1A:
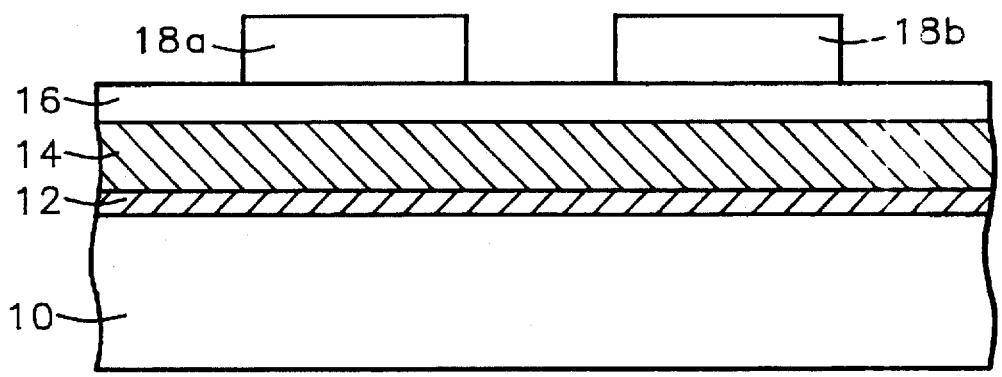
FIG. 1a to FIG. 1e show a semiconductor substrate upon which there is formed a blanket multi-layer metallization stack etched in accord with the preferred embodiments of the present invention.

Referring now to FIG. 1a to FIG. 1e there is shown a series of schematic cross-sectional diagrams illustrating a semiconductor substrate upon which resides a blanket multi-layer metallization stack at progressive stages of processing in accord with the preferred embodiment of the present invention. Shown in FIG. 1a is a semiconductor substrate in accord with the first steps in processing of the preferred embodiment of the present invention.

Shown in FIG. 1a is a semiconductor substrate 10 upon which is formed a blanket barrier metallization layer 12 and a blanket conductor metallization layer 14. The semiconductor substrate 10 upon which the present invention may be practiced includes but is not limited to the active semiconductor region of a semiconductor substrate, as well as conductor and insulator layers which may be formed within or upon the active semiconductor region of a semiconductor substrate or the isolation regions of a semiconductor substrate. Although the preferred embodiment of the present invention depicts the blanket barrier metallization layer 12 residing beneath the blanket conductor metallization layer 14, the relative positions of those two blanket metallization layers may be reversed within practice of the present invention. As well, additional blanket metallization layers may be added to the blanket multi-layer metallization stack upon which is practiced the present invention.

Methods by which blanket barrier metallization layers and blanket conductor metallization layers may be formed upon surfaces of semiconductor substrates are well known in the art. Such methods include but are not limited to thermal evaporation methods, electron beam assisted evaporation methods, Chemical Vapor Deposition (CVD) methods and Physical Vapor Deposition (PVD) sputtering methods. Materials which may be used in forming blanket barrier metallization layers are also well known in the art. Blanket barrier metallization layers may be formed from materials including but not limited to nobel metals, metal silicides, metal nitrides and refractory metal alloys such as titanium-tungsten alloys.

For the preferred embodiment of the present invention, the blanket barrier metallization layer 12 is preferably formed from a barrier material chosen from the group of barrier materials consisting of titanium-tungsten alloy barrier materials, metal silicide barrier materials and metal nitride barrier materials. Most preferably, the blanket barrier metallization layer 12 is formed from a titanium-tungsten alloy barrier material formed upon the semiconductor substrate 10 through a Physical Vapor Deposition (PVD) sputtering process. The titanium-tungsten alloy from which is formed the barrier metallization layer 12 preferably has a titanium concentration in the range of about 5 to about 15 percent. The blanket barrier metallization layer 12 is preferably formed upon the surface of the semiconductor substrate 10 at a thickness of about 1000 to about 3000 angstroms.

Materials from which are formed blanket conductor metallization layers are also well known in the art. Blanket conductor metallization layers are typically formed from aluminum, aluminum containing alloys, tungsten and copper. Typical aluminum containing alloys are aluminum-copper alloys and aluminum-silicon-copper alloys. For the preferred embodiment of the present invention, the blanket conductor metallization layer 14 is preferably formed from either an aluminum containing alloy or from copper. Most preferably, the blanket conductor metallization layer is formed from an aluminum containing alloy containing at least 90 percent aluminum. The blanket conductor metallization layer 14 is preferably formed upon the surface of the semiconductor substrate 10 at a thickness of about 5000 to about 8000 angstroms.

Also shown in FIG. 1a is the presence of a blanket first masking layer 16. For the present invention the blanket first masking layer 16 is preferably formed from an inorganic material deposited upon the surface of the blanket conductor metallization layer 14. Typical inorganic materials from which the blanket first masking layer 16 may be formed include silicon oxide materials, silicon nitride materials and silicon oxynitride materials. Typical methods through which these inorganic materials may be formed upon the semiconductor substrate 10 include, Chemical Vapor Deposition (CVD) methods, Plasma Enhanced Chemical Vapor Deposition (PECVD) methods and Physical Vapor Deposition (PVD) sputtering methods. For the preferred embodiment of the present invention, the blanket first masking layer 16 is preferably formed of a silicon oxide material, a silicon nitride material or a silicon oxynitride material formed upon the surface of the semiconductor substrate 10 at a thickness of about 1000 to about 3000 angstroms.

Finally, there is shown in FIG. 1a patterned second masking layers 18a and 18b. The patterned second masking layers 18a and 18b of the present invention are formed from an organic photoresist material. Methods through which organic photoresist materials may be formed upon semiconductor substrates and patterned to form patterned masking layers are well known in the art. Typically, these methods include spin coating and curing to provide a blanket organic photoresist layer which may be subsequently selectively photo-exposed and developed to yield a patterned organic photoresist layer.

For the present invention, there is no unusual limitation upon the thickness of the blanket organic photoresist layer from which is formed the patterned second masking layers 18a and 18b. With regard to the composition of that blanket organic photoresist layer, it is preferred that the blanket organic photoresist layer be formed from a photoresist composition which, when cured, exhibits limited degradation when exposed to Reactive Ion Etch (RIE) plasmas which are used to pattern the blanket first masking layer and the blanket metallization layers within the blanket multi-layer metallization stack of the present invention. Thus, for the preferred embodiment of the present invention, it has been found experimentally that certain types of photoresists, such as TOK-8900D2B2 (g-line), TOK-CRB2 (g-line) and TOK-IP3100 (i-line) photoresists meet this condition. Other types of photoresists, including but not limited to novolak photoresists and Poly Methly Meth Acrylate (PMMA) photoresists may also meet this condition. Thus, for the preferred embodiment of the present invention it is preferred that the blanket organic photoresist layer from which is formed the patterned second masking layers 18a and 18b be formed from one of those photoresist layers which exhibits limited degradation, preferably at a thickness of about about 15000 to about 20000 angstroms.

Having formed upon the semiconductor substrate 10 the four layer structure comprising the blanket barrier metallization layer 12, the blanket conductor metallization layer 14, the blanket first masking layer 16 and the patterned second masking layers 18a and 18b, the critical Reactive Ion Etch (RIE) etching processes of the preferred embodiment of the present invention may proceed.

Figure 1B:
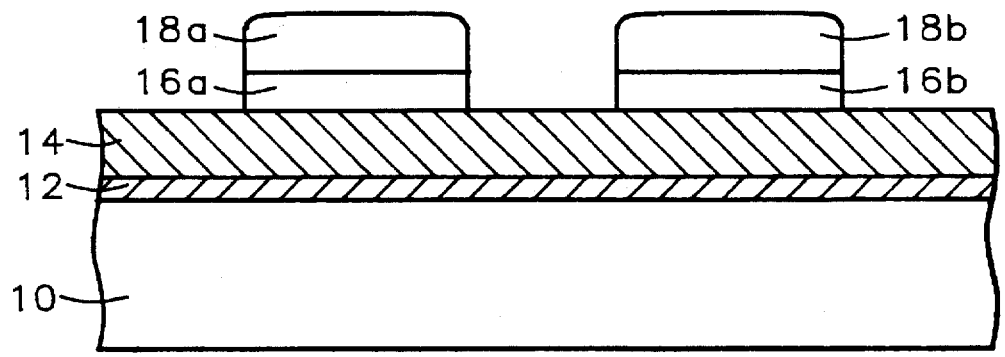

Referring now to FIG. 1b, there is shown a schematic cross-sectional diagram illustrating the first Reactive Ion Etching (RIE) etching process step in the preferred embodiment of the present invention. Shown in FIG. 1b is the etching of the blanket first masking layer 16 into patterned first masking layers 16a and 16b, using as the etch mask the patterned second masking layers 18a and 18b. For the present invention, wherein the blanket first masking layer 16 is formed from a silicon oxide material, a silicon nitride material or a silicon oxynitride material, the blanket first masking layer 16 is etched through exposure to a Reactive Ion Etch (RIE) plasma etchant appropriate to the silicon oxide material, the silicon nitride material or the silicon oxynitride material from which the blanket first masking layer 16 is formed.

For any of the preferred materials from which the blanket first masking layer 16 may be formed, the Reactive Ion Etch (RIE) etching of the material may be accomplished through exposure to a Reactive Ion Etch (RIE) etchant employing fluorine species. Typical fluorine species include but are not limited to carbon tetra-fluoride, tri-fluoro methane and hexa-fluoro ethane. The blanket first masking layer 16 is etched until the patterned first masking layers 16a and 16b are formed, coincident with reaching the surface of the blanket conductor metallization layer 14. Also shown in FIG. 1b is the slight etching of the edges of the patterned second masking layers 18a and 18b which are exposed to the Reactive Ion Etch (RIE) etch plasma used to etch the blanket first masking layer 16.

Figure 1C:
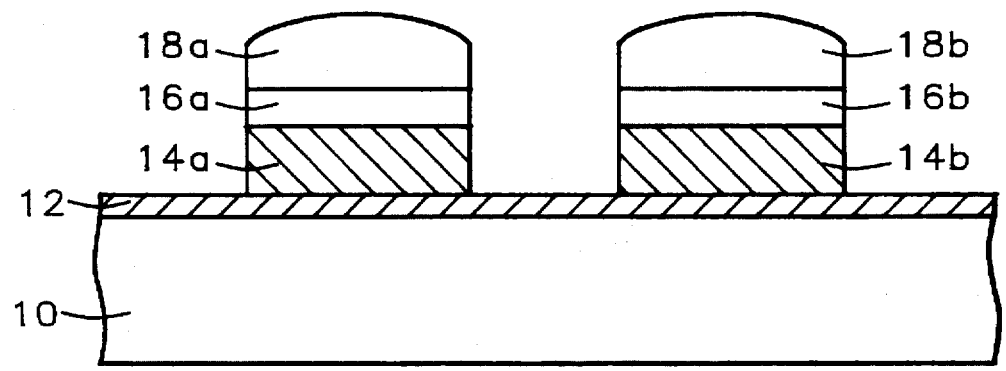

Referring now to FIG. 1c there is shown a cross-sectional diagram illustrating the next process step in accord with the preferred embodiment of the present invention. Shown in FIG. 1c is the etching of the blanket conductor metallization layer 14 to form the patterned conductor metallization layers 14a and 14b. Reactive Ion Etch (RIE) plasma methods for etching blanket conductor metallization layers into patterned conductor metallization layers are known in the art. Typically, aluminum containing blanket conductor metallization layers are etched through exposure to Reactive Ion Etch (RIE) plasmas which contain chlorine species. Typical chlorine species which may be used to etch blanket aluminum containing conductor metallization layers include but are not limited to boron trichloride and chlorine.

For the preferred embodiment of the present invention, the preferred chlorine containing species for etching the blanket conductor metallization layer 14, which is preferably formed from an aluminum alloy, into the patterned conductor metallization layers 14a and 14b is either chlorine or boron trichloride. The aluminum containing blanket conductor metallization layer 14 is etched until it is completely patterned into the patterned conductor metallization layers 14a and 14b coincident with reaching the surface of the blanket barrier metallization layer 12. Also shown in FIG. 1c is the continuing erosion of the surfaces and edges of the patterned second masking layers 18a and 18b upon exposure to the Reactive Ion Etch (RIE) plasma used to pattern the blanket conductor metallization layer 14.

Figure 1D:
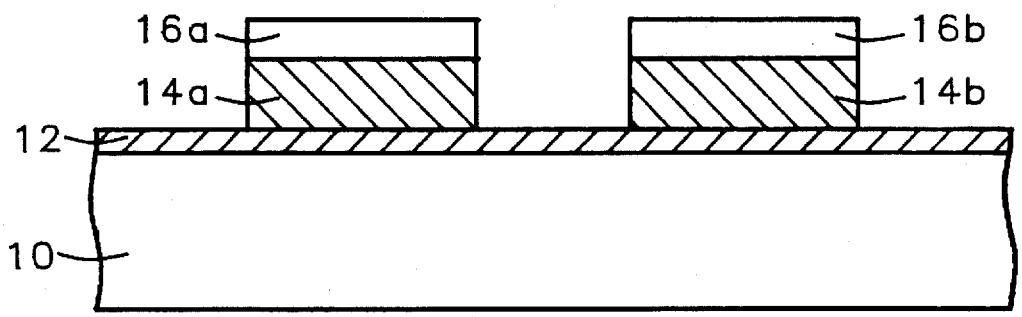

Referring now to FIG. 1d there is shown the next process step in the preferred embodiment of the present invention. Shown in FIG. 1d is the removal of the patterned second masking layers 18a and 18b from the corresponding surfaces of the patterned first masking layers 16a and 16b. It is critical to the preferred embodiment of the present invention that the patterned second masking layers 18a and 18b be removed prior to etching the blanket barrier metallization layer 12. Within the context of the present invention, the patterned second masking layers 18a and 18b could be removed either: (1) immediately subsequent to patterning the blanket first masking layer 16 into the patterned first masking layers 16a and 16b, or (2) immediately subsequent to patterning of the blanket conductor metallization layer 14 into the patterned conductor metallization layers 14a and 14b. It is preferred that the patterned second masking layers 18a and 18b be removed after patterning the blanket conductor metallization layer 14 into the patterned conductor metallization layers 14a and 14b in order to provide optimal patterning characteristics to the aluminum alloy from which is formed the patterned conductor metallization layers 14a and 14b.

Methods through which photoresist masking layers may be removed from semiconductor substrates are known in the art. Such methods include wet chemical methods which employ solvents or solutions through contact with which photoresist masking layers may be dissolved, as well as Reactive Ion Etch (RIE) methods which employ oxygen or activated oxygen species to physically and chemically etch photoresist masking layers from semiconductor substrates. For the preferred embodiment of the present invention, the preferred method through which the patterned second masking layers 18a and 18b are removed from the corresponding surfaces of the patterned first masking layers 16a and 16b is a Reactive Ion Etch (RIE) method undertaken at high pressure employing ozone as an oxidant.

Figure 1E:
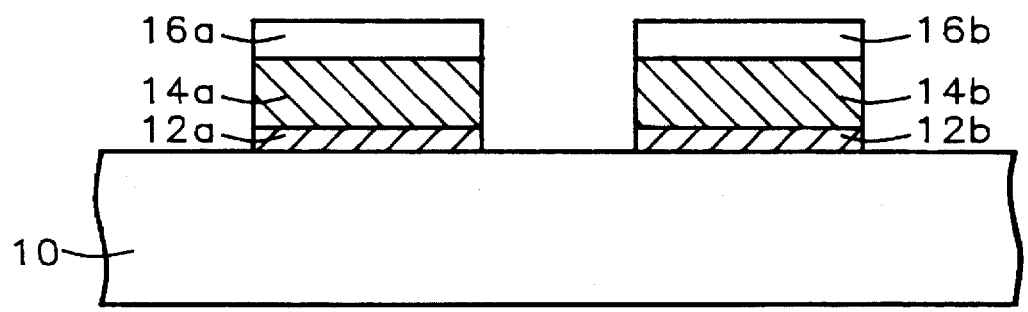

Once the patterned second masking layers 18a and 18b have been removed, the last critical etching process of the preferred embodiment of the present invention may proceed. As shown in FIG. 1e, the last critical etching process is the patterning of the blanket barrier metallization layer 12 into patterned barrier metallization layers 12a and 12b. Analogously to the previous etching processes of the preferred embodiment of the present invention, this process also employs a Reactive Ion Etch (RIE) etching process. The process uses an etchant gas appropriate to the composition of material from which is formed the blanket barrier metallization layer 12. For the most preferred titanium-tungsten alloy from which is formed the blanket barrier metallization layer 12, the preferred Reactive Ion Etch (RIE) etchant is a fluorine containing species. Typical fluorine containing species include but are not limited to carbon tetrafluoride, tri-fluoro methane and sulfur hexa-fluoride. The blanket barrier metallization layer 12 is etched for a time sufficient to etch completely to the semiconductor substrate 10 and simultaneously form the patterned barrier metallization layers 12a and 12b.

Upon completely etching the blanket barrier metallization layer 12, the patterned multi-layer metallization stack of the present invention has been formed. The patterned multi-layer metallization stack formed through the method of the present invention is not susceptible to hardening of the photoresist material used to form the patterned second masking layers 18a and 18b. Nor is the blanket barrier metallization layer 12 of the present invention susceptible to corrosion when the blanket barrier metallization layer 12 is patterned into the patterned barrier metallization layers 12a and 12 b.

An additional characteristic of the preferred embodiment of the present invention is the method and manner through which the multiple successive Reactive Ion Etch (RIE) processes of the present invention are undertaken. It is known in the art that semiconductor substrates whose surfaces are exposed to multipleReactive Ion Etch (RIE) processes may be exposed to those processes through sequential placement of those semiconductor substrates into separate Reactive Ion Etch (RIE) chambers. Alternatively, it is also know in the art that an equivalent Reactive Ion Etch (RIE) processing sequence may be accomplished through selectively introducing into a single Reactive Ion Etch (RIE) chamber, or multiple interconnected Reactive Ion Etch (RIE) chambers, an equivalent sequence of Reactive Ion Etch (RIE) etchant gases.

For the present invention, it is most preferred that the sequential Reactive Ion Etch (RIE) etching processes be undertaken in a single Reactive Ion Etch (RIE) chamber, or multiple interconnected Reactive Ion Etch (RIE) chambers, into which chamber or chambers is provided the proper sequence of Reactive Ion Etch (RIE) etchant gases. When the sequential Reactive Ion Etch (RIE) etching processes of the present invention are undertaken in this in-situ manner, the semiconductor substrate upon which is formed the patterned multi-layer metallization stacks of the present invention is substantially less likely to sustain damage and defects related to handling.

What is claimed is:

1. A method for forming a patterned conductor metallization layer adjoining a patterned barrier metallization layer over a semiconductor substrate comprising:

providing a semiconductor substrate;

forming over the semiconductor substrate a blanket conductor metallization layer adjoining a blanket barrier metallization layer, the blanket barrier metallization layer being formed from a barrier material selected from the group of barrier materials consisting of metal silicide barrier materials and metal nitride barrier materials, where one of the blanket conductor metallization layer and the blanket barrier metallization layer is an upper metallization layer formed further removed from the semiconductor substrate and the other of the blanket conductor metallization and the blanket barrier metallization layer is a lower metallization layer formed closer to the semiconductor substrate;

forming a blanket first masking layer upon the surface of the upper metallization layer, the blanket first masking layer being formed from a material selected from the group of materials consisting of silicon oxide materials, silicon nitride materials and silicon oxynitride materials;

forming a patterned second masking layer upon the surface of the blanket first masking layer;

etching sequentially through a first etch method portions of the blanket first masking layer and the upper metallization layer sequentially exposed through the patterned second masking layer to yield a patterned first masking layer and a patterned upper metallization layer; and etching through a second etch method portions of the lower metallization layer exposed through the pattern of the patterned first masking layer and the patterned upper metallization layer to form a patterned lower metallization layer, where the patterned second masking layer is removed after the first etch method and before the second etch method.

2. The method of claim 1 wherein the patterned second masking layer is formed upon the blanket first masking layer at a thickness of about 15000 to about 20000 angstroms.

3. The method of claim 2 wherein the patterned second masking layer is formed from an organic photoresist.

4. The method of claim 1 wherein the blanket first masking layer is formed upon the upper metallization layer at a thickness of about 1000 to about 3000 angstroms.

5. The method of claim 1 wherein the blanket conductor metallization layer is formed over the semiconductor substrate at a thickness of about 5000 to about 8000 angstroms.

6. The method of claim 5 wherein the blanket conductor metallization layer is formed from an aluminum alloy containing at least 90 percent aluminum.

7. The method of claim 6 wherein the blanket conductor metallization layer is formed from copper.

8. The method of claim 1 wherein the blanket barrier metallization layer is formed upon the semiconductor substrate at a thickness of about 1000 to about 3000 angstroms.

9. A method for forming a patterned conductor metallization layer adjoining a patterned barrier metallization layer over a semiconductor substrate comprising:

providing a semiconductor substrate;

forming over the semiconductor substrate a blanket conductor metallization layer adjoining a blanket barrier metallization layer, the blanket barrier metallization layer being formed from a barrier material selected from the group of barrier materials consisting of metal silicide barrier materials and metal nitride barrier materials, where one of the blanket conductor metallization layer and the blanket barrier metallization layer is an upper metallization layer formed further removed from the semiconductor substrate and the other of the blanket conductor metallization and the blanket barrier metallization layer is a lower metallization layer formed closer to the semiconductor substrate;

forming a blanket first masking layer upon the surface of the upper metallization layer, the blanket first masking layer being formed from a material selected from the group of materials consisting of silicon oxide materials, silicon nitride materials and silicon oxynitride materials;

forming a patterned second masking layer upon the surface of the blanket first masking layer;

etching sequentially in-situ through a first etch method portions of the blanket first masking layer and the upper metallization layer sequentially exposed through the patterned second masking layer to yield a patterned first masking layer and a patterned upper metallization layer;

and etching in-situ through a second etch method portions of the lower metallization layer exposed through the pattern of the patterned first masking layer and the patterned upper metallization layer to form a patterned lower metallization layer, where the patterned second masking layer is removed in-situ after the first etch method and before the second etch method.

10. The method of claim 9 wherein the patterned second masking layer is formed from a an organic photoresist formed upon the blanket first masking layer at a thickness of about 15000 to about 20000 angstroms.

11. The method of claim 10 wherein the patterned second masking layer is removed in-situ through a Reactive Ion Etch (RIE) plasma process employing ozone.

12. The method of claim 9 wherein the blanket first masking layer is formed upon the upper metallization layer at a thickness of about 1000 to about 3000 angstroms.

13. The method of claim 12 wherein the blanket first masking layer is etched in-situ to form the patterned first masking layer through exposure to a Reactive Ion Etch (RIE) plasma containing fluorine species.

14. The method of claim 9 wherein the blanket conductor metallization layer is formed over the semiconductor substrate at a thickness of about 5000 to about 8000 angstroms and the blanket conductor metallization layer is formed from an aluminum alloy which contains at least 90 percent aluminum.

15. The method of claim 14 wherein the blanket conductor metallization layer is etched in-situ to form the patterned conductor metallization layer through exposure to a Reactive Ion Etch (RIE) plasma containing chlorine species.

16. The method of claim 9 wherein the blanket barrier metallization layer is formed upon the semiconductor substrate at a thickness of about 1000 to about 3000 angstroms.

* * * * *